(12) United States Patent
Sekiya

(10) Patent No.: US 6,465,158 B1
(45) Date of Patent: Oct. 15, 2002

(54) SEMICONDUCTOR WAFER DIVIDING METHOD

(75) Inventor: Kazuma Sekiya, Tokyo (JP)

(73) Assignee: Disco Corporation, Tokyo (JP)

(*) Notice: Subject to any disclaimer, the term of this patent is extended or adjusted under 35 U.S.C. 154(b) by 39 days.

(21) Appl. No.: 09/691,208

(22) Filed: Oct. 19, 2000

(30) Foreign Application Priority Data

Oct. 26, 1999 (JP) .......................................... 11-303852

(51) Int. Cl.[7] ................................................ G03F 7/00
(52) U.S. Cl. ...................... 430/313; 430/311; 438/462
(58) Field of Search ................................ 430/322, 323, 430/325, 311, 313; 438/33, 113, 460, 462

(56) References Cited

FOREIGN PATENT DOCUMENTS

| JP | 8-279479 | * 10/1996 |
| JP | 10-83976 A | * 3/1998 |

* cited by examiner

*Primary Examiner*—Kathleen Duda
(74) *Attorney, Agent, or Firm*—Smith, Gambrell & Russell, LLP

(57) ABSTRACT

A semiconductor wafer dividing method for dividing a semiconductor wafer, on whose face side many rectangular areas are demarcated by streets arranged in a lattice fashion, along the streets to convert each of the many rectangular areas into a semiconductor chip. In this method, a resist is formed on the face side of the semiconductor wafer. Then, the resist is physically removed in areas extending along the streets. Then, an etching process is applied to the semiconductor wafer to etch the semiconductor wafer along the streets.

5 Claims, 2 Drawing Sheets

SEMICONDUCTOR WAFER DIVIDING METHOD

FIELD OF THE INVENTION

This invention relates to a semiconductor wafer dividing method for dividing a semiconductor wafer, especially a thin semiconductor wafer, into many semiconductor chips. More particularly, the invention relates to a semiconductor wafer dividing method for dividing a semiconductor wafer along streets, which are arranged in a lattice fashion on the face side of the semiconductor wafer, into many semiconductor chips.

DESCRIPTION OF THE PRIOR ART

As is well known among people skilled in the art, the production of a semiconductor device requires that a nearly disc-shaped semiconductor wafer be divided into many rectangular semiconductor chips. Streets arranged in a lattice fashion are present on the face side of the semiconductor wafer, and these streets demarcate many rectangular areas. In each of the rectangular areas, a circuit is disposed. The semiconductor wafer is divided along the streets, whereby each of the many rectangular areas is formed into a semiconductor chip.

A typical method for dividing the semiconductor wafer along the streets is the use of a dicer. A dicer has a disc-shaped rotating blade, which is relatively moved along the streets to cut the semiconductor wafer along the streets. Recently, a considerably thin (e.g., 50 $\mu$m or less) semiconductor wafer has often been used. If the semiconductor wafer is thin, the semiconductor wafer dividing method using a dicer involves the following problems: When the thin semiconductor wafer is cut with the rotating blade, a tiny nick tends to be made in the cut edge, and stress tends to remain in the cut edge portion. Such a nick and/or stress may decrease the strength of the resulting semiconductor chip. Even if an external force or thermal shock acting on the semiconductor chip is relatively small, the semiconductor chip may be broken.

A method for dividing a semiconductor wafer by etching, instead of cutting with a rotating blade, has also been proposed. With this dividing method, a photoresist is formed on the face side of the semiconductor wafer. Then, the photoresist is exposed to light along streets, and the photoresist is removed along the streets. Then, the semiconductor wafer is subjected to etching, whereby the semiconductor wafer is selectively etched along the streets. As a result, the semiconductor wafer is divided along the streets. According to this method, a tiny nick and/or stress can be avoided. However, this method requires that a photomask for exposure of the photoresist along the streets be kept on hand for each of various semiconductor wafers. For this and other reasons, the expenses for the division of the semiconductor wafer are considerably high. If a pattern formed of a substance, which substantially cannot be etched, is produced on the streets, such a pattern inhibits etching along the streets. This makes it impossible to apply a dividing method using etching. In the case of a semiconductor wafer made of silicon, for example, if a pattern formed from a metal such as copper or aluminum is present on the streets, an etching process exclusive to silicon cannot etch the metal forming the pattern.

SUMMARY OF THE INVENTION

A principal object of the present invention is to provide a novel and improved method which can produce a semiconductor chip by dividing a semiconductor wafer along streets, without causing a tiny nick and/or stress to decrease the strength of the resulting semiconductor chip, and without requiring a relatively expensive photomask.

Another object of the invention is to provide a novel and improved method which can divide a semiconductor wafer as required, even if a pattern formed from a substance, which cannot be etched, is present on the streets.

To attain the principal object, the present invention performs a unique physical removal step of physically removing a resist, which has been formed on the face side of a semiconductor wafer, in areas extending along streets.

As a semiconductor wafer dividing method for attaining the principal object, the invention provides a semiconductor wafer dividing method for dividing a semiconductor wafer, on whose face side many rectangular areas are demarcated by streets arranged in a lattice fashion, along the streets to convert each of the many rectangular areas into a semiconductor chip, comprising:

a masking step of forming a resist on the face side of the semiconductor wafer;

a physical removal step of physically removing the resist in areas extending along the streets after the masking step; and an etching step of applying an etching process to the semiconductor wafer after the physical removal step to etch the semiconductor wafer along the streets.

In the physical removal step, it is preferred to cut the resist along the streets by means of a disc-shaped rotating blade. The remaining object is attained by removing not only the resist, but also a pattern formed from a substance, which cannot be etched, in the areas extending along the streets in the physical removal step. In a preferred embodiment, the semiconductor wafer has a thickness of 50 $\mu$m or less, and the resist has a thickness of 5 to 15 $\mu$m.

DETAILED DESCRIPTION OF THE PREFERRED EMBODIMENT

Preferred embodiments of the semiconductor wafer dividing method of the present invention will be described in greater detail by reference to the accompanying drawings.

Figure 1:
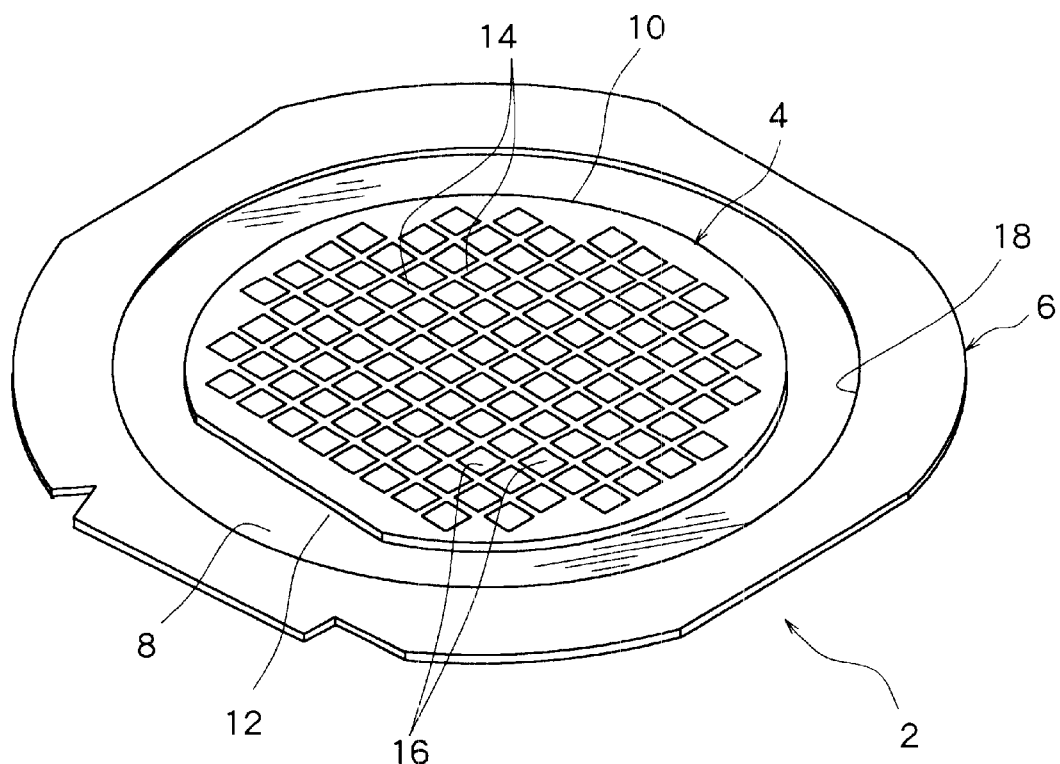
FIG. 1 is a perspective view showing an assembly including a semiconductor wafer to be divided by a semiconductor wafer dividing method in accordance with the present invention.

FIG. 1 illustrates a semiconductor wafer assembly 2, which includes a frame 6 and a mounting tape 8 along with a semiconductor wafer 4 to be divided by the dividing method of the invention. The semiconductor wafer 4 of a well known shape per se is nearly disc-shaped as a whole, and its outer peripheral edge includes an arcuate main portion 10 and a relatively short linear portion 12 called orientation flat. The dividing method of the invention can be applied to an arbitrary semiconductor wafer. However, the semiconductor wafer 4, to which the dividing method of the invention is preferably applicable, is relatively thin, and has a thickness of 50 μm or less, for example. Many streets 14 arranged in a lattice fashion are disposed on the face side of the semiconductor wafer 4, and these streets 14 demarcate many rectangular areas 16. A required circuit (not shown) is formed in each of the rectangular areas 16. As will be detailed later on, the semiconductor wafer 4 is divided along the streets 14 to convert each of the rectangular areas 16 into a semiconductor chip. The frame 6 in the assembly 2 is formed from a plastic or metallic plate material, and has a relatively large-diameter, circular mounting opening 18 at the center thereof. The mounting tape 8 extending across the mounting opening 18 of the frame 6 is bonded to the back side of the frame 6 and the back side of the semiconductor wafer 4, whereby the semiconductor wafer 4 is mounted in the mounting opening 18 of the frame 6. The mounting tape 8 may be formed from a suitable plastic tape.

Figure 2:
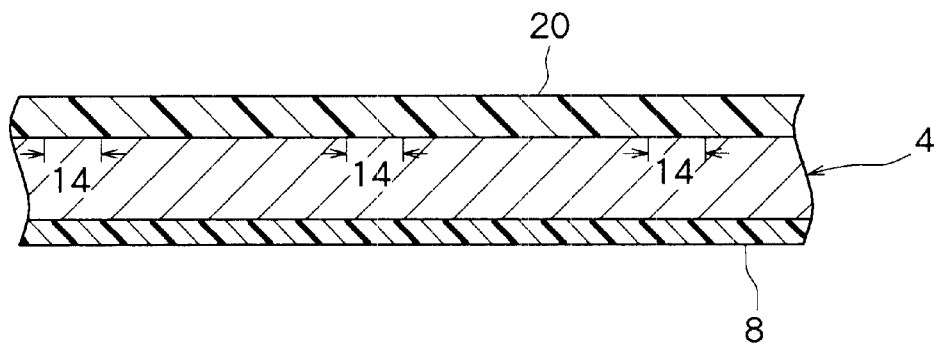
FIG. 2 is a partial sectional view showing a resist formed on the face side of the semiconductor wafer.
Figure 3:
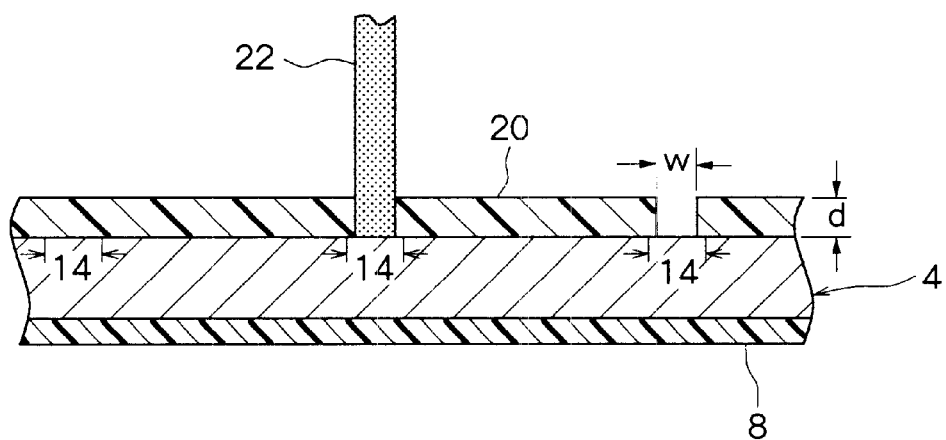
FIG. 3 is a partial sectional view showing an example of a method for physically removing the resist, which has been formed on the face side of the semiconductor wafer, in areas extending along streets.
Figure 4:
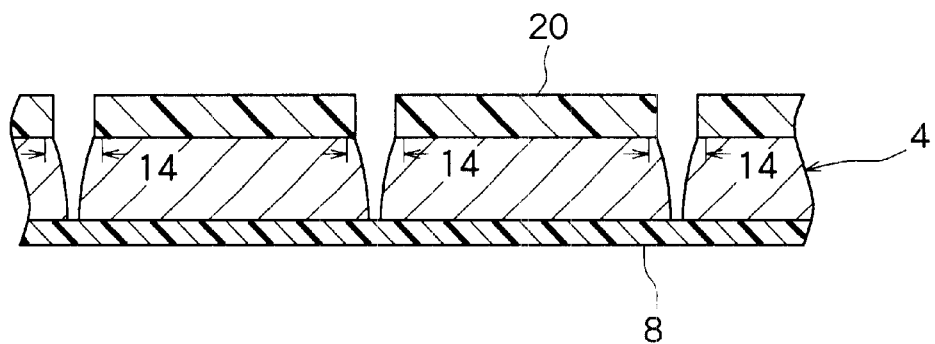
FIG. 4 is a partial sectional view showing the semiconductor wafer divided by etching along the streets.

FIGS. 2 to 4 schematically show a preferred embodiment of a semiconductor wafer dividing method according to the invention. In the semiconductor wafer dividing method of the invention, a masking step is performed initially. In the masking step, as shown in FIG. 2, a resist 20 is formed on the face side of the semiconductor wafer 4 in the semiconductor wafer assembly 2. Importantly, the resist 20 has the property of being unetched during an etching step which will be performed later. The resist 20 can be formed from a suitable polymeric material well known among people skilled in the art. The thickness of the resist 20 is preferably about 5 to 15 μm. Such resist 20 can be formed favorably by use of a spin coater (not shown) well known per se. In the masking step using the spin coater, the semiconductor wafer 4 is vacuum attracted to a rotating chuck of the spin coater. While the rotating chuck is being rotated at a high speed, a solution containing a material for the resist is applied dropwise to the face side of the semiconductor wafer 4 to form a coating of the solution on the face side of the semiconductor wafer 4. Instead of the spin coating method using the spin coater, other suitable method, such as roller coating for coating the solution by means of a roller, can be used to form the resist 20.

In the semiconductor wafer dividing method of the invention, it is important that a physical removal step be carried out after the masking step. In the physical removal step, as shown in FIG. 3, the resist 20 is partly removed in areas extending along the streets 14 disposed on the face side of the semiconductor wafer 4. Removal of the resist 20 is effected physically. In a preferred physical removal method, its removal is performed with the use of a dicer well known per se which has a disc-shaped rotating blade 22 favorably containing diamond grains (only a part of the disc-shaped rotating blade 22 of the dicer is shown in FIG. 3). In the physical removal method using the dicer, a lower end of the rotating blade 22 is positioned by a predetermined cutting depth d below the face side of the resist 20. With the rotating blade 22 being rotated at a high speed, the rotating blade 22 and the semiconductor wafer 4 are moved relative to each other along the streets 14. Thus, the resist 20 is cut with the rotating blade 22 along the streets 14. The cutting depth d can be set to be substantially the same as the thickness of the resist 20 (accordingly, the resist 20 is cut all over its thickness, while the semiconductor wafer 4 itself is substantially not cut). Alternatively, the cutting depth d can be set to be slightly larger than the thickness of the resist 20 (accordingly, the resist 20 is cut all over its thickness, and the semiconductor wafer 4 itself also has a slight cut formed in its surface). A cutting width w can be set to be substantially the same as, or slightly smaller than, the width of the street 14.

If a pattern formed from a substance which cannot be etched by an etching process to be described later on, for example, copper or aluminum, is present on the streets 14 disposed on the face side of the semiconductor wafer 4, it is necessary, during the physical removal step, to remove this pattern as well as the resist 20 in areas extending along the streets 14.

In the physical removal step, there is need to cut the resist 20 in the areas extending along the streets 14. Thus, it is important to align the rotating blade 22 and the street 14 sufficiently precisely. If the resist 20 is so opaque that the street 14 cannot be detected with an ordinary optical system, it is possible to detect the street 14 with an optical system using infrared radiation and align the rotating blade 22 and the street 14.

After the above-described physical removal step, an etching step is performed. During the etching step, the semiconductor wafer 4 is etched in areas where the resist 20 is partially removed, accordingly, in areas extending along the streets 14, as shown in FIG. 4. The etching depth of the semiconductor wafer 4 may be substantially the same as the thickness of the semiconductor wafer 4 (thus, the semiconductor wafer 4 is divided along the streets 14), as shown in FIG. 4. Even when the semiconductor wafer 4 is divided along the streets 14, the semiconductor wafer assembly 2 is retained integrally, because the mounting tape 8 is bonded to the back side of the semiconductor wafer 4. If desired, instead of etching the semiconductor wafer 4 throughout its thickness, unetched regions may be left by a slight thickness beside the back side. In this case, a slight bending force is later exerted on the semiconductor wafer 4 along the streets 14 to break the remaining unetched regions. In this manner, the semiconductor wafer 4 can be divided.

According to the experience of the inventor of the present invention, when a slight cut is formed in the face side of the semiconductor wafer 4 itself during the physical removal step, some stress can be caused to the semiconductor wafer 4 because of this cut. However, such stress is eliminated by carrying out the etching step.

The etching step can be performed by an etching method well known per se. It may be wet etching which comprises applying an etchant (e.g., a mixture of hydrofluoric acid and nitric acid, or a solution of potassium hydroxide for the semiconductor wafer made of silicon) to the semiconductor wafer 4. In place of this wet method, dry etching may be adopted, such as plasma etching which utilizes active particles in a plasma produced by applying a high frequency electric field to a gas, or sputter etching utilizing accelerated ions.

After the etching step is completed, the resulting individual rectangular areas 16 of the semiconductor wafer 4 are detached from the mounting tape 8. Then, or before their detachment, a suitable liquid is applied to remove the resist 20, which is existent on the surface of the individual rectangular areas 16 of the semiconductor wafer 4, chemically or by low temperature combustion. In this manner, many semiconductor chips are produced.

What I claim is:

1. A semiconductor wafer dividing method for dividing a semiconductor wafer, on whose face side many rectangular areas are demarcated by streets arranged in a lattice fashion, along the streets to convert each of the many rectangular areas into a semiconductor chip, comprising:

a masking step of forming a resist on the face side of the semiconductor wafer;

a physical removal step of physically removing the resist in areas extending along the streets after the masking step; and an etching step of applying an etching process to the semiconductor wafer after the physical removal step to etch the semiconductor wafer along the streets.

2. The method of claim 1, wherein:

in the physical removal step, the resist is cut along the streets by means of a disc-shaped rotating blade.

3. The method of claim 1, wherein:

a pattern formed from a substance, which substantially cannot be etched by the etching process, is present on the streets, and not only the resist, but also the pattern is removed in the areas extending along the streets in the physical removal step.

4. The method of claim 1, wherein:

the semiconductor wafer has a thickness of 50 $\mu$m or less.

5. The method of claim 1, wherein:

the resist has a thickness of 5 to 15 $\mu$m.

\* \* \* \* \*